US008921015B2

(12) United States Patent  
Li et al.

(10) Patent No.: US 8,921,015 B2  
(45) Date of Patent: Dec. 30, 2014

(54) MASK REPAIR WITH PASSIVATION

(71) Applicant: Taiwan Semiconductor Manufacturing Company, Ltd., Hsin-Chu (TW)

(72) Inventors: Yueh-Hsun Li, Kaohsiung (TW); Yuan-Chih Chu, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 65 days.

(21) Appl. No.: 13/757,051

(22) Filed: Feb. 1, 2013

(65) Prior Publication Data

US 2014/0220480 A1 Aug. 7, 2014

(51) Int. Cl.
*G03F 1/72* (2012.01)
*G03F 1/82* (2012.01)

(52) U.S. Cl.
CPC ........................................ *G03F 1/72* (2013.01)
USPC ............................................................ 430/5

(58) Field of Classification Search
CPC ................ G03F 1/26; G03F 1/72; G03F 1/82
USPC .......................... 430/5, 30, 322, 394; 382/144
See application file for complete search history.

(56) References Cited

U.S. PATENT DOCUMENTS 7,473,496 B2 * 1/2009 Cheng ................................ 430/5
7,527,901 B2 * 5/2009 Lee et al. .......................... 430/5

* cited by examiner

*Primary Examiner* — Stephen Rosasco  
(74) *Attorney, Agent, or Firm* — Haynes and Boone, LLP

(57) ABSTRACT

A method for repairing masks includes performing a first repair process to a mask by etching unwanted opaque regions from the mask, applying a plasma passivation process to the mask, and performing a second repair process to the mask by etching away additional unwanted opaque regions.

20 Claims, 7 Drawing Sheets

MASK REPAIR WITH PASSIVATION

BACKGROUND

Photolithography is a common technique used in the manufacture of semiconductor products. Photolithography processes involve the formation of features by using a photo-mask to expose certain regions of a photo-resist layer to light. The exposed or unexposed regions are then developed away to expose a semiconductor layer underneath the photo-resist. The exposed semiconductor layer can then have various processes performed thereon such as etching or doping.

A photo-mask typically includes a transparent layer with an opaque layer formed on top. Specific regions of the opaque layer are then removed to expose the transparent layer underneath. The transparent regions can thus allow light to travel through to expose specific regions of a photo-resist layer to light, typically an ultra-violet type of light.

Sometimes, however, errors occur during the formation of a mask. These errors should be repaired before the mask is used. There may be several regions of the mask which have to be repaired by etching away opaque regions where those regions are not wanted. It is sometimes better to perform these repairs individually rather than with a single etching process.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1A:
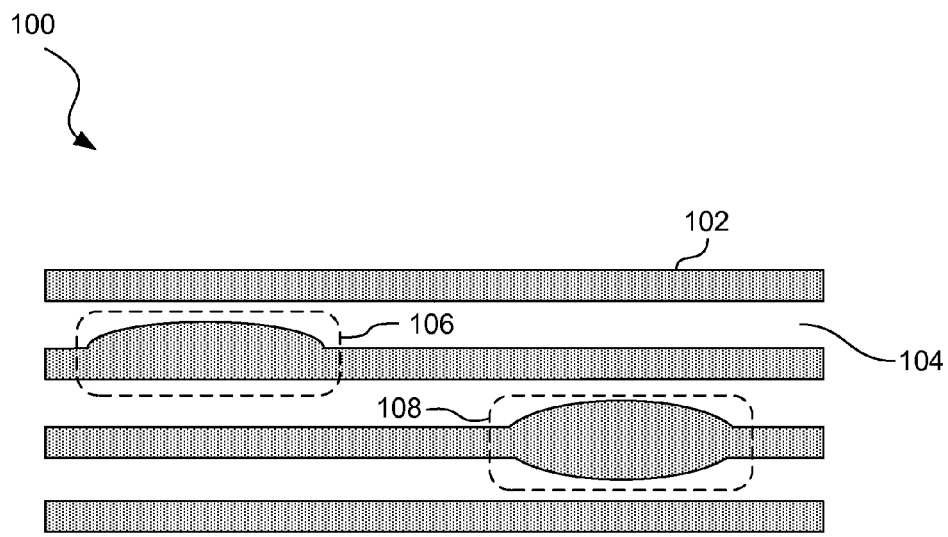
FIG. 1A is a diagram showing an illustrative top view of a mask to be repaired, according to one example of principles described herein.

Referring now to the figures, FIG. 1A is a diagram showing an illustrative top view of a mask 100 to be repaired. As mentioned above, errors may occur during the formation of a photo-mask. It is more economically efficient to repair the mask rather than to discard the mask and create a new one.

FIG. 1A illustrates a number of opaque lines 102 over a transparent layer 104. A relatively common error that occurs during the formation of a mask 100 is that certain regions of the opaque layer remain in areas where the transparent layer 104 should be exposed. For example, various defective regions 106, 108 may appear where the opaque material 102 expands into unwanted areas. Various repair processes may be used which can etch away this unwanted opaque material 102.

Figure 1B:
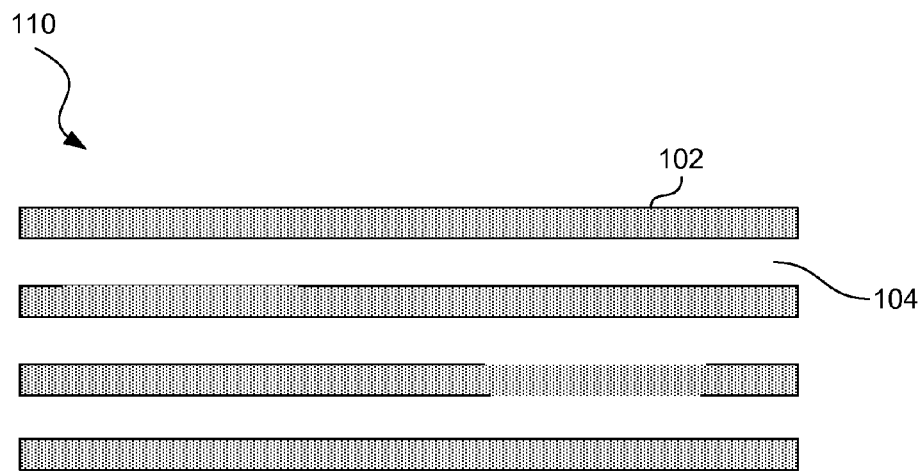
FIG. 1B is a diagram showing an illustrative top view of a mask after a repair process, according to one example of principles described herein.

FIG. 1B is a diagram showing an illustrative top view of a mask 110 after a repair process. As can be seen from the illustrations, the defective regions 106, 108 have been repaired so that the opaque material 102 no longer expands over the transparent layer 104. In some cases, this repair process is done in a single etching session where each defective region is removed. In some other cases, different defective regions can be repaired during different etching sessions. This, however, can cause issues because a previous etching process can adversely affect the opaque material 102 during a subsequent etching process.

Figure 2A:
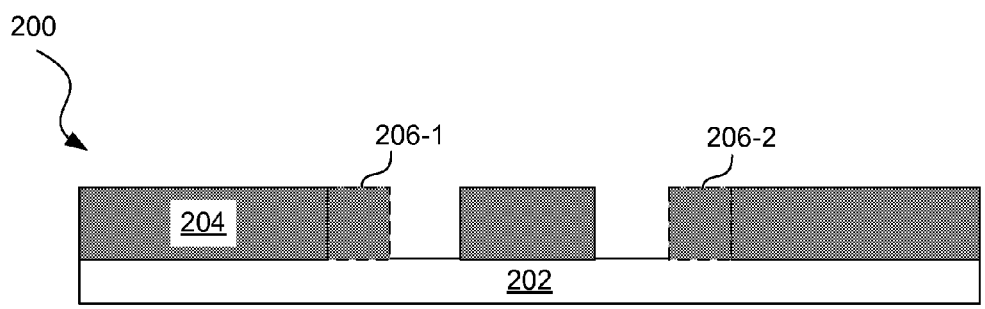
FIGS. 2A-2D are diagrams showing an illustrative repair process using passivation, according to one example of principles described herein.

FIGS. 2A-2D are diagrams showing an illustrative repair process using passivation. FIG. 2A illustrates a photo-mask that includes a transparent layer 202 and an opaque layer 204. The opaque layer includes two defective regions 206-1, 206-2 where the opaque material expands into unwanted areas and covers more of the transparent layer 202 than is desired.

Figure 2B:
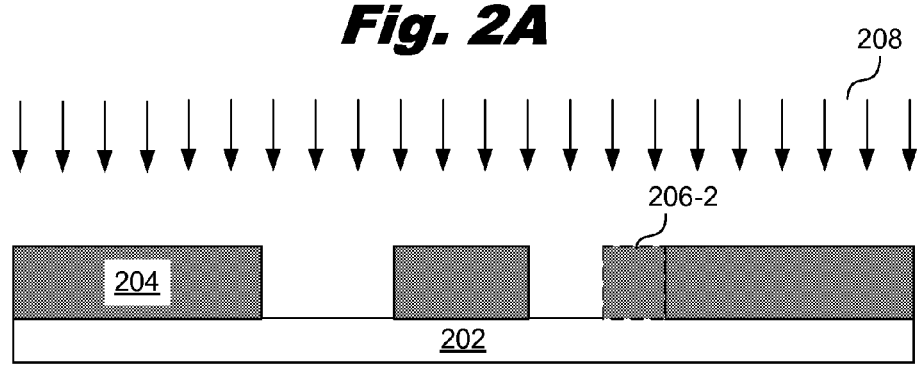

FIG. 2B is a diagram showing an illustrative first repair process 208. According to the present example, an etching repair process 208 is performed to remove the first defective region 206-1. While only one defective region is shown being repaired by the first repair process 208, it may be the case that a number of defective regions, but not all of the defective regions, are repaired by the first repair process 208. This repair process 208, however, leaves the area around the first defective region 206-1 relatively unstable.

Figure 2C:
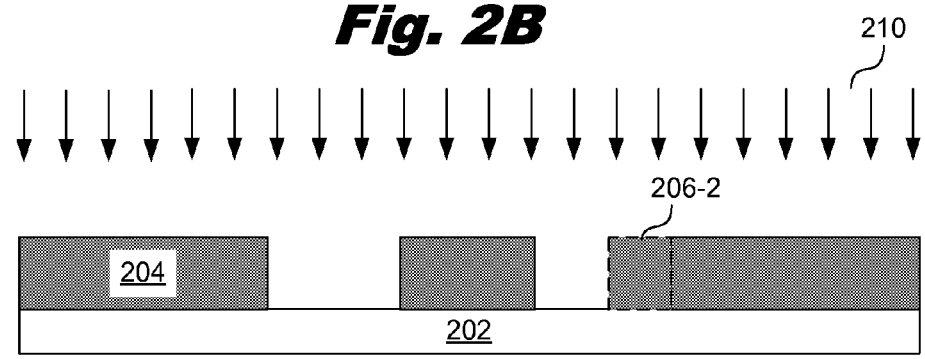

FIG. 2C is a diagram showing an illustrative passivation process 210. According to the present example, after performing the first repair process 108 but before performing a second repair process, a plasma passivation process 210 is applied to the mask. Various types of plasma passivation processes exist. For example, oxygen plasma passivation may be used in accordance with principles described herein. The plasma passivation process is used to stabilize the opaque material so that it is not improperly affected during a subsequent etching repair process. Particularly, the opaque material around the area where the first defective region 206-1 was removed is more stable as a result of the passivation process 210 and will thus be less adversely affected during subsequent repair processes.

Figure 2D:
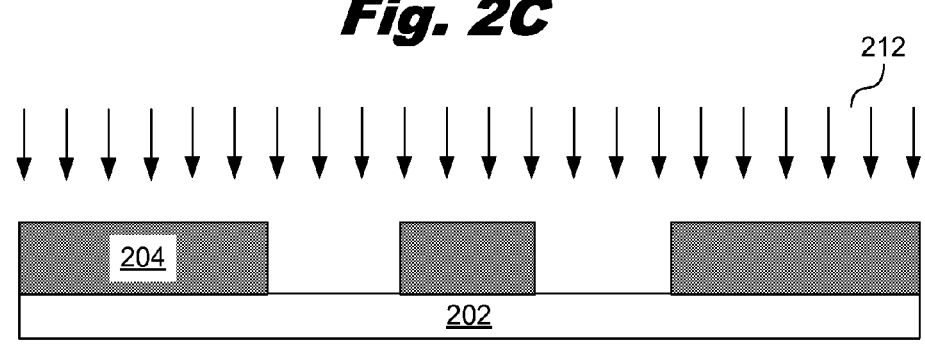

FIG. 2D is a diagram showing an illustrative second repair process 212. According to the present example, after performing the passivation process 210, a second repair process 212 is performed on the mask. The second repair process 212 repairs the second defective region 206-2. While only one defective region is shown being repaired by the second repair process 212, it may be the case that a number of defective regions, but not all of the defective regions, are repaired by the second repair process 212. Because the passivation process 210 was performed before the second repair process 212, the area around the first defective region 206-1 removed during the first repair process 208 is less adversely affected.

Figure 3A:
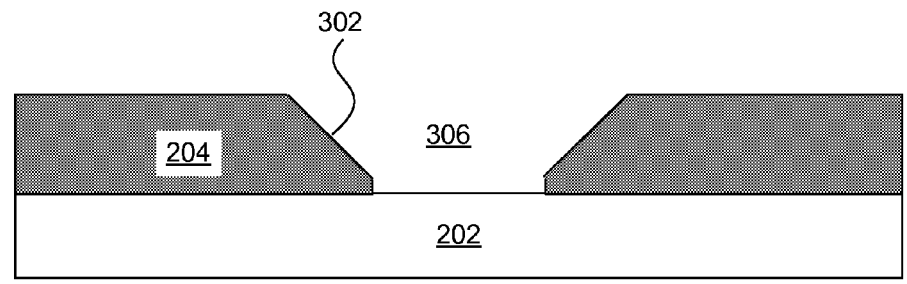
FIGS. 3A and 3B illustrate the difference between performing multiple repair processes with and without using a plasma passivation process, according to one example of principles described herein.
Figure 3B:
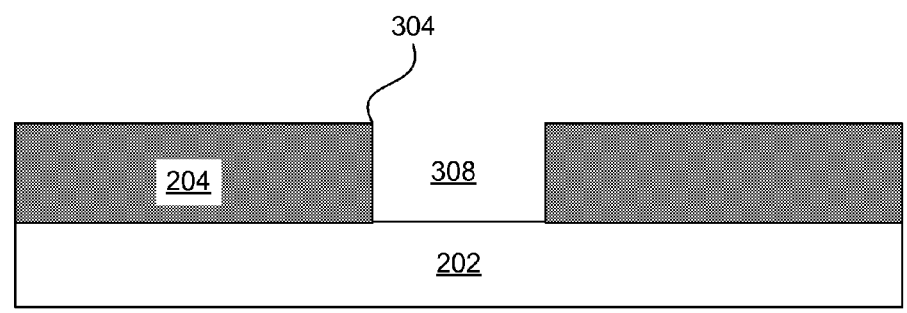

FIGS. 3A and 3B illustrate the difference between performing multiple repair processes with and without using a plasma passivation process. FIG. 3A is a diagram showing an illustrative side view of a mask feature 306 after a second repair in the case that a plasma passivation process is not used after the previous repair process. According to the present example, a previous etching repair process for the feature 306 leaves the opaque material 204 in the area 302 around the feature 306 in a less stable state. Thus, during the present repair process for a different defective region, more of the opaque material 204 is unintentionally removed. This results in a less than ideal photo-mask because certain repaired features may expose too much of the transparent layer 202.

If the photo-mask includes transparent regions that are bigger than desired, then the features formed onto a semiconductor substrate will be bigger than desired. This can be problematic, particularly if a minimum distance for a critical dimension is violated. When forming various features on the nanometer scale, there are certain dimensions which are deemed critical. That is, they are dimensions which have important minimum distances. For example, in the case of features that include several lines, the critical dimension is the pitch. The pitch defines the distance between the side of one feature and the corresponding side of an adjacent feature. If the pitch is below a predefined minimum distance, then unacceptable errors may occur within the circuitry formed by those features. Such errors may include short circuits. Thus, when examining the mask, it is important to ensure that the minimum distance for the critical dimension of the features on the mask has not been violated as a result of the repair process. If so, then the repair process may have to be redone.

FIG. 3B is a diagram showing an illustrative side view of a mask feature after a second repair in which a plasma passivation process was used. According to the present example, the feature 308 remains as it should because after it was repaired, a plasma passivation process was used to stabilize the fresh area 304 around the feature. Thus, a subsequent etching repair process for a different feature did not adversely affect this feature 308.

Figure 4:
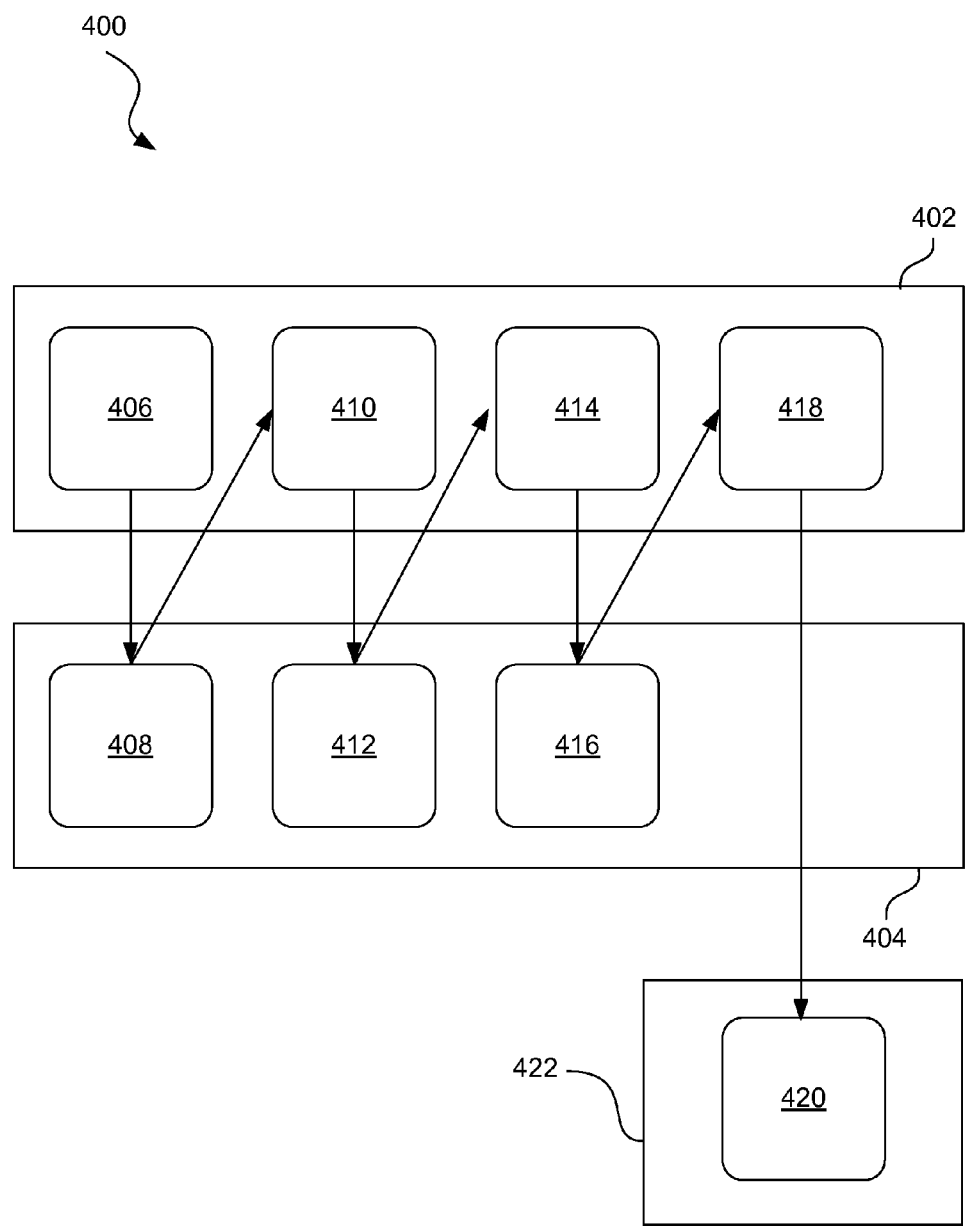
FIG. 4 is a diagram showing an illustrative repair sequence that includes using passivation, according to one example of principles described herein.

FIG. 4 is a diagram showing an illustrative repair sequence 400 that includes using passivation. According to the present example, the etching repair processes are performed in an etching chamber 402. The plasma passivation processes, however, are performed in a separate passivation chamber 404. Thus, after each etching repair, the mask is unloaded from the etching chamber 402 and loaded into the passivation chamber 404 if a subsequent repair is yet to be performed. After the passivation process, the mask is unloaded from the passivation chamber 404 and put back into the etching chamber 402 for a subsequent repair process.

According to the present example, the mask is loaded into the etching chamber 402 for a first etching repair process 406. The mask is then loaded into the passivation chamber 404 to perform a first passivation process 408. This process continues as the mask is again loaded into the etching chamber 402 for a second etching repair process 410. The mask is then again loaded into the passivation chamber 404 to perform a second passivation process 412. This process continues as the mask is again loaded into the etching chamber 402 for a third etching repair process 414. The mask is then again loaded into the passivation chamber 404 to perform a third passivation process 416. The mask is then loaded into the etching chamber 402 for a final repair process 418. Because there are no more etching repairs to be made, no further passivation process is applied.

In some examples, there may be defective regions in the mask that have to be repaired by depositing additional opaque material. In such cases, after all of the etching repairs have been completed, the mask is loaded into a deposition repair chamber 422. The deposition repair process 420 is then performed. The deposition repair process 420 may involve one or more deposition related repairs.

Figure 5:
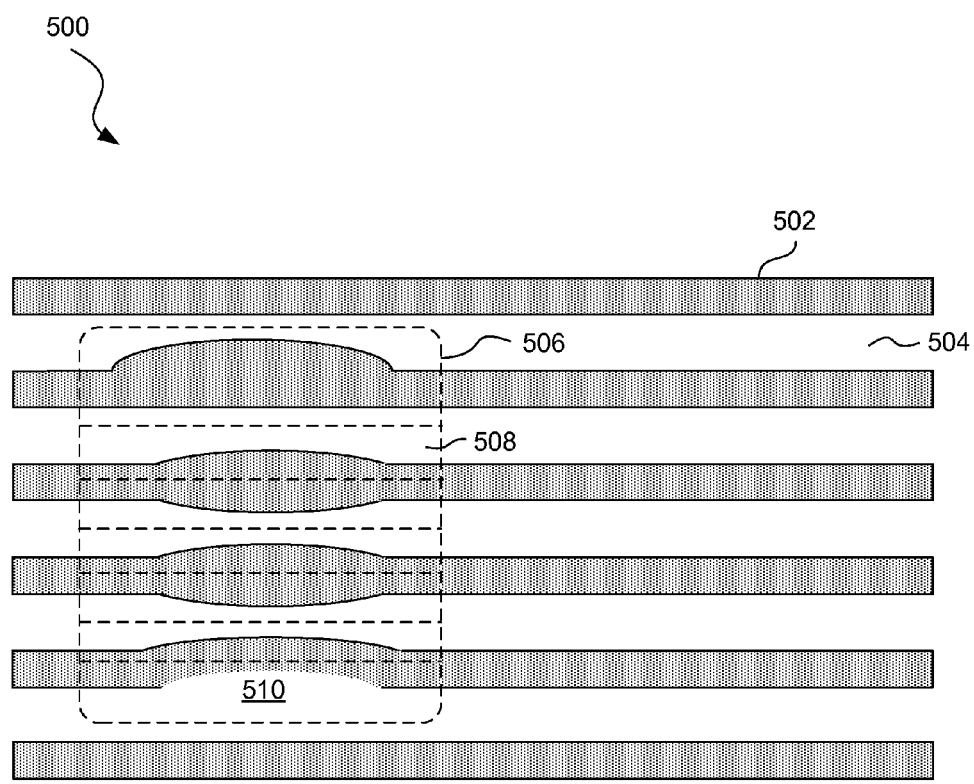
FIG. 5 is a diagram showing a defective region divided into sub-regions for repair, according to one example of principles described herein.

FIG. 5 is a diagram showing a defective region divided into sub-regions for repair. According to the present example, FIG. 5 illustrates a mask 500 with a number of features defined by opaque material 502 on top of a transparent material 504. During the formation of the mask, an error occurred that led to the defective region 506 as defined by the rounded, dotted square. As mentioned above, it can be beneficial to perform etching repairs one-by-one rather than in a single process. Thus, the defective region 506 is divided up into sub-regions 508. These sub-regions may be referred to as repair sub-regions 508.

According to the present example, the repair sub-regions each correspond to one side of a line of opaque material. In some examples, there may be several features repaired for each etching repair process. For example, it may be the case that for each etching repair process, four features are repaired. In between each of those repair processes, a plasma passivation process is performed.

In some examples, a deposition repair may be performed to fill in a portion of opaque material that was unintentionally removed. For example, the feature 510 illustrated in FIG. 5 shows a region etched out of the line. According to the present example, deposition repairs may be performed last after all the etching repairs are completed.

In some examples, the etching repair may be examined by various checking tools to ensure that the etching process was performed appropriately and that the minimum distances for critical dimensions were not violated. If the etching repair was performed properly, then the repair process may continue. If the etching process was not performed properly, then the appropriate steps to remedy the deficiency may be taken.

Figure 6:
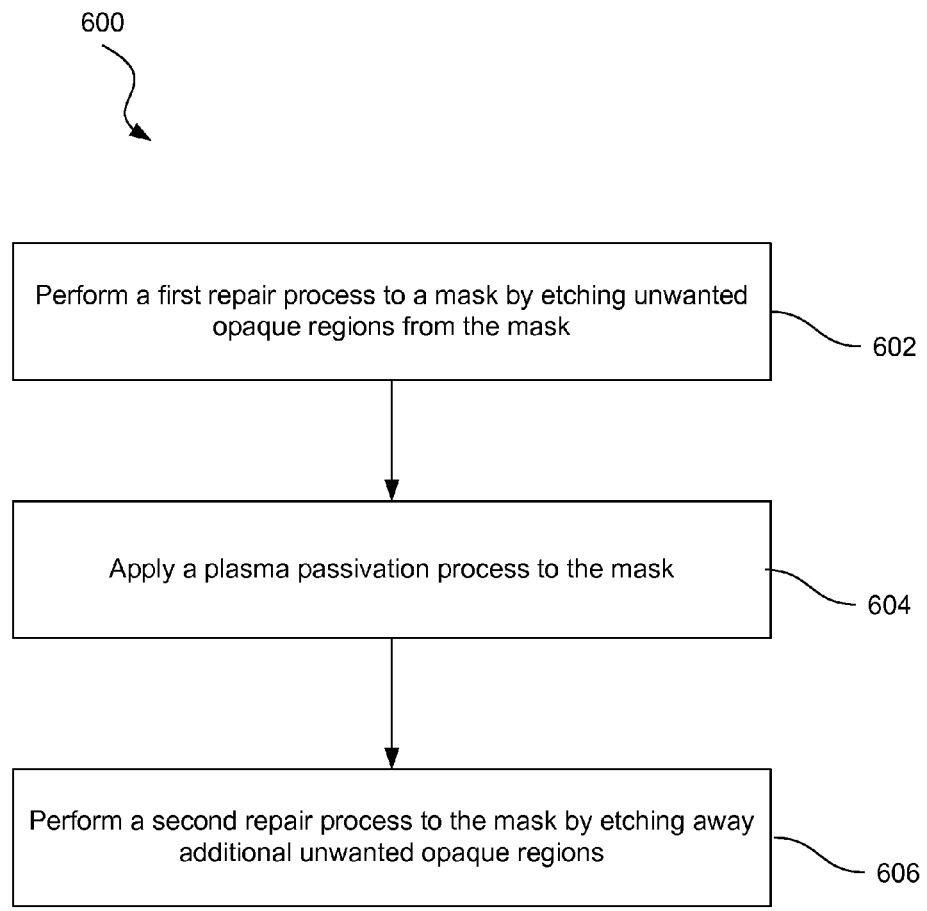
FIG. 6 is a flowchart showing an illustrative method for repairing a mask using passivation between repairs, according to one example of principles described herein.

FIG. 6 is a flowchart showing an illustrative method 600 for repairing a mask using passivation between repairs. According to the present example, the method includes a step of performing 602 a first repair process to a mask by etching unwanted opaque regions from the mask. The method also includes a step of applying 604 a plasma passivation process to the mask. The method further includes a step of performing 606 a second repair process to the mask by etching away additional unwanted opaque regions.

Figure 7:
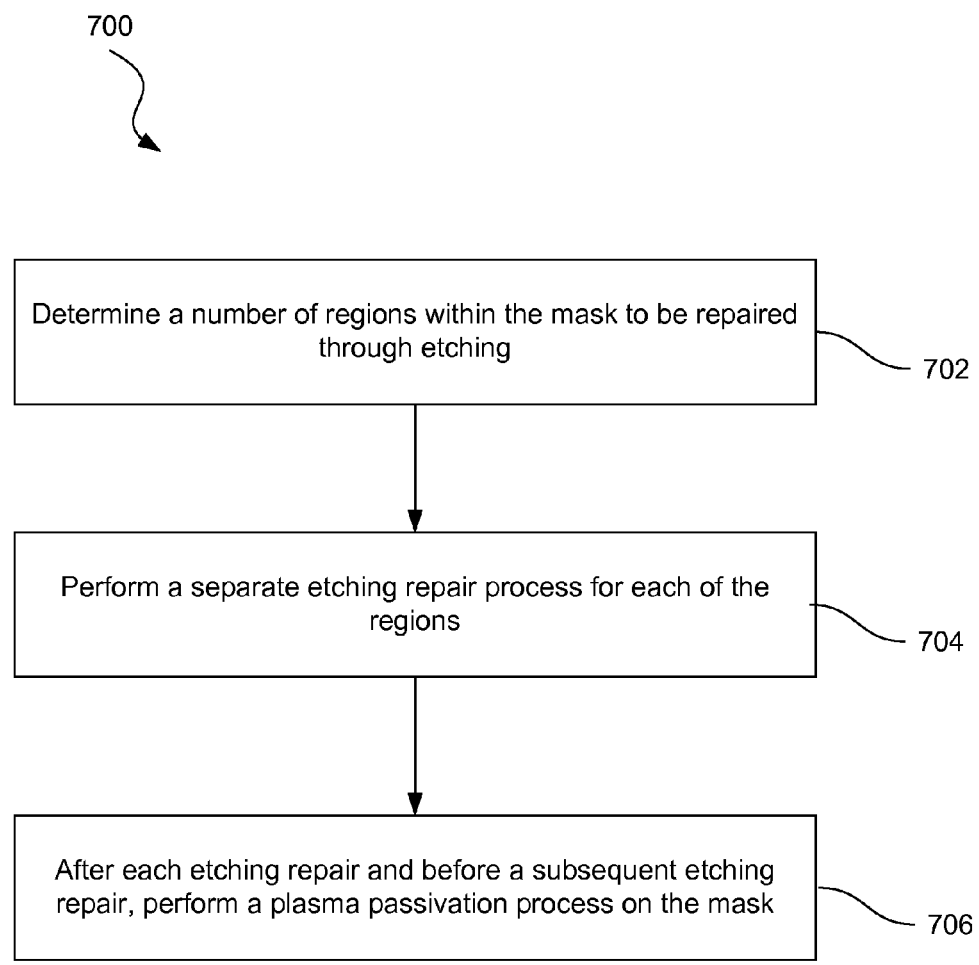
FIG. 7 is a flowchart showing an illustrative method for repairing a mask using passivation between repairs, according to one example of principles described herein.

FIG. 7 is a flowchart showing an illustrative method 700 for repairing a mask using passivation between repairs. According to the present example, the method includes a step of determining 702 a number of regions within the mask to be repaired through etching. The method also includes a step of performing 704 a separate etching repair process for each of the regions. The method further includes a step of performing 706 a plasma passivation process on the mask and after each etching repair and before a subsequent etching repair.

According to certain illustrative examples, a method for repairing photo-masks includes performing a first repair process to a mask by etching unwanted opaque regions from the mask, applying a plasma passivation process to the mask, and performing a second repair process to the mask by etching away additional unwanted opaque regions.

According to certain illustrative examples, a method for repairing a photo-mask includes determining a number of regions within the mask to be repaired through etching, performing a separate etching repair process for each of the regions, and after each etching repair and before a subsequent etching repair, performing a plasma passivation process on the mask.

According to certain illustrative examples, a repair system includes an etching repair chamber and a plasma passivation chamber. The system is configured to, with the etching repair chamber, perform a number of etching repairs to a mask in the repair chamber. The system is also configured to, with the plasma passivation chamber, perform a plasma passivation process between each of the etching repairs.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A method for repairing a mask, the method comprising:
receiving the mask, wherein the mask includes a plurality of unwanted opaque regions;
performing a first repair process on the mask by etching an unwanted opaque region from the mask;
applying a first plasma passivation process to the mask, wherein the applying of the first plasma passivation process to the mask includes generating a passivation layer on an additional unwanted opaque region; and
performing a second repair process on the mask by etching away the additional unwanted opaque region including a portion of the passivation layer formed thereupon.

2. The method of claim 1, wherein the mask is placed in an etching repair chamber for the etching repair processes and placed in a plasma passivation chamber for the plasma passivation process.

3. The method of claim 1, further comprising,
performing a second plasma passivation process to the mask after the second repair process; and
after performing the second plasma passivation process, performing a third repair process.

4. The method of claim 1, further comprising:
after all etching related repairs are completed, performing a deposition repair process.

5. The method of claim 1, further comprising:
dividing a defective region into a set of repair sub-regions; and
performing a separate etching repair process for each repair sub-region while performing a passivation process between each repair process.

6. The method of claim 1, wherein the plasma passivation process comprises an oxygen ($O_2$) plasma passivation process.

7. The method of claim 1, further comprising, checking the mask after each repair process to determine whether a minimum distance of a critical dimension has been violated.

8. The method of claim 1, wherein the mask comprises an Extreme Ultra-Violet (EUV) mask.

9. A method for repairing a mask, the method comprising:
identifying a plurality of regions within the mask to be repaired through etching;
performing a first etching repair process for a first region of the plurality of regions;
performing a second etching repair process for a second region of the plurality of regions; and
between the performing of the first etching repair process and the performing of the second etching repair process, performing a plasma passivation process on the mask,
wherein the plasma passivation process includes generating a passivation layer on an opaque region within the second region, and
wherein the second etching repair process etches the opaque region and a portion of the passivation layer formed thereupon.

10. The method of claim 9, wherein the mask is placed in an etching repair chamber for the etching repair and placed in a plasma passivation chamber for the plasma passivation process.

11. The method of claim 9, further comprising, after all etching related repairs are completed, performing a deposition repair process.

12. The method of claim 9, wherein each of the first repair process and the second repair process comprises etching away at least one unwanted opaque region within the mask.

13. The method of claim 9, wherein the plasma passivation process comprises an oxygen ($O_2$) plasma passivation process.

14. The method of claim 9, further comprising, checking the mask after each repair process to determine whether a critical dimension has been violated.

15. A method for use in a repair system having an etching repair chamber, and a plasma passivation chamber, the method comprising:
- with the etching repair chamber, performing a first etching repair and a second etching repair to a mask in the etching repair chamber; and
- with the plasma passivation chamber, performing a plasma passivation process on the mask between each of the first etching repair and the second etching repair,
  - wherein the plasma passivation process includes generating a passivation layer on an opaque region within the mask, and
  - wherein the second etching repair removes a portion of the passivation layer on the opaque region.

16. The method of claim 15, wherein the repair system further includes a deposition repair chamber, the method further comprising:
- with the deposition chamber, performing a deposition repair process after all etching related repairs are completed.

17. The method of claim 15, wherein the first etching repair and the second etching repair comprise etching away unwanted opaque regions within the mask.

18. The method of claim 15, wherein the plasma passivation process comprises an oxygen ($O_2$) plasma passivation process.

19. The method of claim 15, wherein the repair system further comprises a checking tool, the method further comprising:
- with the checking tool, determining, after each etching repair, whether a critical dimension has been violated.

20. The method of claim 15, wherein each of the first etching repair and the second etching repair is performed on a different sub-region of a defective region within the mask.

* * * * *